United States Patent
Marsh (10) Patent No.: US 8,420,534 B2
(45) Date of Patent: Apr. 16, 2013

(54) ATOMIC LAYER DEPOSITION OF CRYSTALLINE PRCAMNO (PCMO) AND RELATED METHODS

(75) Inventor: Eugene P. Marsh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/902,590

(22) Filed: Oct. 12, 2010

(65) Prior Publication Data

US 2012/0086104 A1    Apr. 12, 2012

(51) Int. Cl.
*H01L 29/92*    (2006.01)
*H01L 21/02*    (2006.01)

(52) U.S. Cl.
USPC .. 438/680; 438/3; 257/E29.342; 257/E21.009

(58) Field of Classification Search ............... 438/3, 680
See application file for complete search history.

(56) References Cited

U.S. PATENT DOCUMENTS

| | | | |
|---|---|---|---|
| 6,984,591 B1 * | 1/2006 | Buchanan et al. | 438/778 |
| 7,457,147 B2 | 11/2008 | Rinerson et al. | |
| 2001/0024387 A1 * | 9/2001 | Raaijmakers et al. | 365/200 |
| 2007/0018219 A1 | 1/2007 | Lim et al. | |
| 2008/0210924 A1 | 9/2008 | Shin | |
| 2009/0225582 A1 * | 9/2009 | Schloss | 365/148 |
| 2009/0226612 A1 | 9/2009 | Ogawa et al. | |
| 2009/0236568 A1 | 9/2009 | Letessier et al. | |
| 2009/0242852 A1 | 10/2009 | Gatineau et al. | |
| 2009/0298252 A1 | 12/2009 | Meijer et al. | |
| 2010/0006810 A1 | 1/2010 | Kim et al. | |

FOREIGN PATENT DOCUMENTS

| | | |
|---|---|---|
| KR | 10-0694316 | 3/2007 |
| KR | 10-0785509 | 12/2007 |
| WO | 2008088563 A2 | 7/2008 |

OTHER PUBLICATIONS

Burkey et al., Encapsulated Alkaline-Earth Metallocenes. 2.1 Triisopropylcyclopentadienyl Systems, [(C3H7)3C5H2]2Ae(THF)n (Ae = Ca, Sr, Ba; n = 0-2), and the Crystal Structure of [(C3H7)3C5H2]2Ba(THF)2, Organometallics, vol. 12, 1993, pp. 1331-1337.

Hatanpaa et al., Synthesis and Characterisation of Cyclopentadianyl Complexes of Barium: Precursors for Atomic Layer Deposition of BaTiO3, Journal of Royal Society of Chemistry, 2004, pp. 1181-1188.

Jones et al., Recent Developments in the MOCVD and ALD of Rare Earth Oxides and Silicates, Materials Science and Engineering B, vol. 118, 2005, pp. 97-104.

Kim et al., Resistive Switching Characteristics of Pro0.7Ca0.3MnO3 Thin Films Grown on Glass Substrates by Pulsed Laser Deposition, Thin Solid Films, vol. 515, 2006, pp. 2573-2576.

Kukli et al., Atomic Layer Deposition of Calcium Oxide and Calcium Hafnium Oxide Films Using Calcium Cyclopentadienyl Precursor, Thin Solid Films, vol. 500, 2006, pp. 322-329.

Xu et al., U.S. Appl. No. 60/855,404, Precursor Compositions for ALD/CVD of Group II Ruthenate Thin Films, filed Jan. 17, 2007.

(Continued)

*Primary Examiner* — Alexander Ghyka
(74) *Attorney, Agent, or Firm* — TraskBritt (57) ABSTRACT

Methods of forming a PrCaMnO (PCMO) material by atomic layer deposition. The methods include separately exposing a surface of a substrate to a manganese-containing precursor, an oxygen-containing precursor, a praseodymium-containing precursor and a calcium-containing precursor. The resulting PCMO material is crystalline. A semiconductor device structure including the PCMO material, and related methods, are also disclosed.

20 Claims, 2 Drawing Sheets

OTHER PUBLICATIONS

International Search Report for PCT Application No. PCT/US2011/055609, mailed May 9, 2012.

International Written Opinion for PCT Application No. PCT/US2011/055609, mailed May 9, 2012.

* cited by examiner

ATOMIC LAYER DEPOSITION OF CRYSTALLINE PRCAMNO (PCMO) AND RELATED METHODS

TECHNICAL FIELD

Embodiments of the present disclosure relate to semiconductor memory fabrication and, more specifically, to methods for forming a crystalline PrCaMnO (PCMO) material by atomic layer deposition (ALD), and to related structures and methods.

BACKGROUND

As conventional semiconductor memory, such as Flash memory and dynamic random access memory (DRAM), reach their scaling limits, research has focused on commercially viable low power, low operation voltage, high speed and high-density non-volatile memory devices. One example of such a non-volatile memory device is a variable resistance memory device including a programmable resistive memory material formed from a material exhibiting a very large negative magnetoresistance, often referred to as a so-called "colossal magnetoresistance" (CMR) material. The CMR material may be connected to a current controlling device, such as a diode, a field effect transistor (FET), or a bipolar junction transistor (BJT).

The resistance of the CMR material remains constant until a high electric field induces current flow through the CMR material, resulting in a change in the CMR resistance. During a programming process, the resistivity of the memory resistor at the high field region near the electrode changes first. Experimental data shows that the resistivity of the material at the cathode is increased while that at the anode is decreased. During an erase process, the pulse polarity is reversed. That is, the designation of cathode and anode are reversed. Then, the resistivity of the material near the cathode is decreased, and the resistivity near the anode is increased.

One example of a CMR material is a manganese oxide of the general formula $R_{1-x}M_xMnO_3$, wherein R is a rare earth element, M is a metal (e.g., calcium, strontium or barium), and x is a number from about 0.1 to about 0.9. The CMR material is often referred to as "CMR manganites." CMR manganites exhibit reversible resistive switching properties, which may be used for low power, low operation voltage, high speed and high-density memory applications.

PrCaMnO (PCMO) is a CMR manganite that is currently being explored due to its potential for use in variable resistance memory devices. Amorphous PCMO may be deposited using a variety of methods, such as physical vapor deposition (PVD), metal-organic chemical vapor deposition (MOCVD), and spin-coating. However, the resistive switching characteristics of PCMO have been shown to improve as the PCMO reaches a crystalline phase. To convert amorphous PCMO to the crystalline phase such that the PCMO exhibits properties useful in variable resistance memory devices, the amorphous PCMO may be exposed to temperatures of greater than about 400° C. For example, after depositing the amorphous PCMO using a conventional CVD process, an annealing process is performed to convert the amorphous PCMO to crystalline PCMO by exposing the amorphous PCMO to a temperature of about 525° C.

Alternatively, an MOCVD process may be performed at increased temperatures (i.e., about 600° C.) to form crystalline PCMO. However, PCMO materials formed at temperatures greater than 550° C. may exhibit decreased resistive switching characteristics. While not wishing to be bound by any particular theory, it is believed that decomposition of the MOCVD reactants may lead to uncontrolled growth of the PCMO. Precursors for depositing PCMO, such as bis(2,2,6,6-tetramethyl-3,5-heptanedionato)calcium ($Ca(tmhd)_2$), $Pr(tmhd)_3$, and $Mn(tmhd)_2$, have been explored for use in CVD processes. Due to their low reactivity, the precursors are deposited at increased temperatures and are codeposited with oxygen. Accordingly, depositing materials by ALD using such precursors may be difficult to control or altogether unsuccessful.

Exposing semiconductor memory of memory device structures to increased temperatures during fabrication may cause degradation of heat-sensitive components, such as metal wiring and interconnects. Thus, it is desired to conduct semiconductor memory fabrication acts at relatively low temperatures (e.g., less than about 450° C.) to prevent such degradation.

DETAILED DESCRIPTION

As used herein, the terms "atomic layer deposition" or "ALD" mean and include a vapor deposition process in which a plurality of separate deposition cycles are conducted in a chamber. During each cycle, a metal precursor is chemisorbed to a substrate surface, excess precursor is purged out of the chamber, a subsequent precursor and/or reaction gas is introduced to react with the chemisorbed species and excess reaction gas and byproducts are removed from the chamber. As compared to a conventional chemical vapor deposition (CVD) process where a desired material is deposited onto the substrate in a single cycle from vaporized metal precursor compounds (and any reaction gases used) within a chamber, the multi-cycle ALD process enables improved control of layer thickness by self-limiting growth and minimizing detrimental gas phase reactions by separation of the reaction components. The term "atomic layer deposition," as used herein, includes "atomic layer epitaxy" (ALE), molecular beam epitaxy (MBE), gas source MBE, organometallic MBE, and chemical beam epitaxy when performed with alternating pulses of precursor compound(s), reaction gas(es), and purge (i.e., inert carrier) gas.

As used herein, the term "PCMO" means and includes a compound having the general formula $Pr_{1-x}Ca_xMnO_3$, wherein x is a number of from about 0.1 to about 0.9. Examples of stoichiometries for PCMO include, but are not limited to, $Pr_{0.7}Ca_{0.3}MnO_3$, $Pr_{0.5}Ca_{0.5}MnO_3$ and $Pr_{0.67}Ca_{0.33}MnO_3$.

As used herein, the term "CMR manganite" means and includes a compound having the general formula $R_{1-x}M_xMnO_3$, wherein R is a rare earth element, such as praseodymium (Pr), lanthanum (La) or neodymium (Nd), M is a metal, such as calcium (Ca), strontium (Sr) or barium (Ba) and x is a number of from about 0.1 to about 0.9. Examples of CMR manganites include, but are not limited to, PCMO, $Pr_{1-x}Sr_xMnO_3$ (PSMO), PrCaSrMnO$_3$ (PCSMO), $La_{1-x}Sr_xMnO_3$ (LSMO), $La_{1-x}Ca_xMnO_3$ (LCMO), $Nd_{1-x}Sr_xMnO_3$ (NSMO) and $Nd_{1-x}Sr_xMnO_3$ (NSMO).

As used herein, the term "Cp" means and includes a cyclopentadienyl ($C_5H_5$) ligand having all five carbon atoms bound to a metal in $\eta^5$-coordination by $\pi$ bonding. The Cp ligand may be substituted or unsubstituted, such as with an alkyl group.

As used herein, the term "alkyl" means and includes a saturated hydrocarbon chain having from one carbon atom to six carbon atoms in length including, but not limited to, methyl, ethyl, propyl and butyl. The alkyl group may be straight-chain or branched-chain. Further, as used herein, "Me" represents methyl, "Et" represents ethyl, "iPr" represents isopropyl and "tBu" represents tert-butyl.

As used herein, the term "chemisorb" means and includes forming a chemical linkage or bond between a chemical species and a surface, such as that of a substrate. The term "chemisorbed," as used herein, means and includes a chemical species chemically linked or bonded to the surface.

The following description provides specific details, such as material types and processing conditions in order to provide a thorough description of embodiments of the present disclosure. However, a person of ordinary skill in the art would understand that the embodiments of the present disclosure may be practiced without employing these specific details. Indeed, the embodiments of the present disclosure may be practiced in conjunction with conventional fabrication techniques employed in the industry. In addition, the description provided below does not form a complete process flow for manufacturing a semiconductor device. The semiconductor device structures described below do not form a complete semiconductor device. Only those process acts and structures necessary to understand the embodiments of the present disclosure are described in detail below. Additional acts to form a complete semiconductor device from the semiconductor device structures may be performed by conventional fabrication techniques.

Methods for forming a PCMO material on a substrate by atomic layer deposition (ALD) are disclosed. In particular, the methods may be used to form a PCMO material having a crystalline structure ("crystalline PCMO"). The methods may include separately introducing a manganese-containing precursor, an oxygen-containing precursor, a praseodymium-containing precursor and a calcium-containing precursor to an exposed surface of the substrate to form the crystalline PCMO material. Each of these precursors may be introduced to the substrate under conditions that enable metal (i.e., manganese, praseodymium or calcium) and/or oxygen from the precursor to chemisorb to the substrate or to react with another metal previously chemisorbed on the substrate, forming the PCMO material. Each of the precursors may be contacted with the surface of the substrate at a temperature of less than about 450° C. and, thus, the method may be used to form the crystalline PCMO material on semiconductor structures without damaging or degrading exposed metal components, such as copper interconnects or wiring.

The precursors for forming the PCMO material by ALD may include precursor compounds including a complex of a metal and a ligand. As a non-limiting example, the metal may include at least one of manganese, praseodymium and calcium and the ligand may include a substituted or unsubstituted cyclopentadienyl ligand ("Cp") or a ketoimine ligand, such as di-t-butyl ketoimine. Examples of precursors that may be used include, but are not limited to, compounds having the formula $M(Cp)_n$, $M(MeCp)_n$, $M(EtCp)_n$, $M(iPrCp)_n$, $M(tBuCp)_n$, $M(Me_4C_p)_n$, $M(Me_5Cp)_n$, $MCp(CO)_n$, $MMeCp(CO)_n$ and $M(tmhd)_y$, wherein M represents at least one of manganese, praseodymium and calcium, and n or y are a number of ligands used to balance the charge of the metal. The number of ligands n or y may be selected based on the valence state of the metal used in the precursor. By way of example, n or y may be an integer ranging from 1 to 3.

As a non-limiting example, a manganese-containing precursor may include a compound having the formula $MnCp(CO)_3$, or $MnMeCpCO_3$. As another non-limiting example, a praseodymium-containing precursor may include a compound having the formula $Pr(RCp)_3$, wherein R is an alkyl group. As yet another non-limiting example, a calcium-containing precursor may include a compound having the formula $Ca(RCp)_2$, wherein R is an alkyl group. Suitable alkyl groups may be selected based upon the molecular weight, size, branching or steric hindrance to impart the precursor with a desired volatility for use in the ALD process.

Additional metal-containing ALD precursors may be used in combination with, or in addition to, the specific precursors described herein. Such additional precursors are known in the art of ALD. While methods of depositing a PCMO material by ALD are specifically described herein, the methods may be used to deposit any CMR manganite material. For example, at least one of a strontium-containing precursor (e.g., $Sr(tBuCp)_2$ or $Sr(tmhd)_2$), a lanthanum-containing precursor (e.g., $La(iPrCp)_3$), and a neodymium-containing precursor ($Nd(iPrCp)_3$) may be exposed to the surface of the substrate to form a desired CMR manganite material.

As will be described, the precursors (i.e., the manganese-containing precursor, the praseodymium-containing precursor and the calcium-containing precursor) may, optionally, be vaporized and deposited/chemisorbed substantially simultaneously with, and in the presence of, an oxygen-containing precursor. For example, the manganese-containing precursor, the praseodymium-containing precursor, the calcium-containing precursor and the oxygen-containing precursor may be sequentially introduced to the surface of the substrate to form the crystalline PCMO material over the surface of the substrate. As a non-limiting example, the oxygen-containing precursor may include an oxygen-containing gas, such as ozone ($O_3$), oxygen ($O_2$) or nitric oxide (NO).

Figure 1:
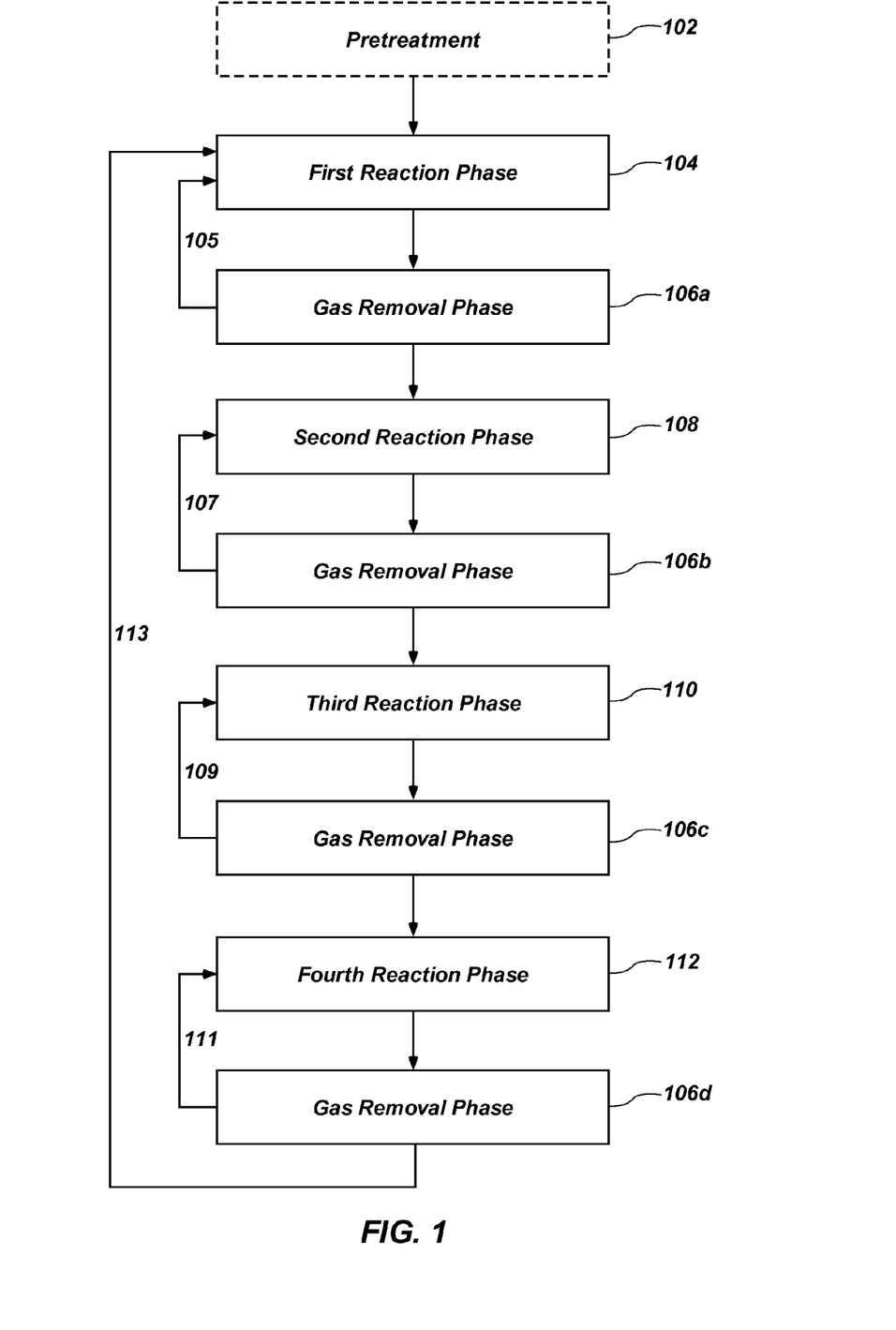
FIG. 1 is a flow diagram illustrating a method of forming a crystalline PCMO material on a substrate by ALD in accordance with embodiments of the disclosure.

FIG. 1 is a flow diagram illustrating an embodiment of a method of forming a CMR manganite material or PCMO material by an ALD process. As shown in FIG. 1, pretreatment 102, as depicted by dashed lines, of a substrate surface may, optionally, be performed to increase reactivity of the substrate surface toward ALD precursors. The pretreatment 102 may be performed on the substrate surface using a conventional process, such as a polishing process, an etching process, an oxidation process, a hydroxylation process, or an annealing process. For example, the substrate surface may be pretreated to be terminated with at least one functional group, such as a hydroxyl group, an alkoxy group or a halide group.

In a first reaction phase 104 of the ALD process, the manganese-containing precursor may be introduced to a chamber in a gaseous state and may chemisorb to the substrate surface. The manganese-containing precursor may include any manganese-containing compound suitable for use as an ALD precursor. For example, the manganese-containing precursor may include at least one of cyclopentadienylmanganese tricarbonyl ($CpMn(CO)_3$), bis(cyclopentadienyl)manganese ($MnCp_2$), bis(ethylcyclopentadienyl)manganese (($CpEt)_2Mn$), methylcyclopentadienylmanganese tricarbonyl (($CH_3C_5H_4)Mn(CO)_3$), each of which may be obtained commercially from Strem Chemicals, Inc. (Newburyport, Mass.). As a non-limiting example, the manganese-containing precursor may be introduced into the chamber by flowing an inert gas (e.g., nitrogen ($N_2$), argon (Ar), helium (He), neon (Ne), krypton (Kr), or xenon (Xe)) into the manganese-containing precursor to form a mixture of the manganese-containing precursor and the inert gas. As another non-limiting example, the manganese-containing precursor may be dissolved in a solvent, such as tetrahydrofuran (THF), to form a solution of the manganese-containing precursor, which solution may be vaporized and supplied into the chamber. The manganese-containing precursor may be supplied to the chamber as the mixture or the solution. The manganese-containing precursor supplied in this phase may be selected such that the amount of manganese-containing precursor available to bind to the substrate surface is determined by the number of available binding sites and by the physical size of the chemisorbed species (including ligands). The manganese chemisorbed on the substrate surface during exposure to the manganese-containing precursor is self-terminated with a surface that is non-reactive with the remaining manganese-containing precursor.

A gas removal phase 106a that includes a pump and purge sequence may be performed to remove excess manganese-containing precursor and/or byproducts from the substrate surface. Pulsing with an inert gas removes the excess manganese-containing precursor from the chamber, specifically the manganese-containing precursor that has not chemisorbed to the substrate surface. Purging the chamber also removes volatile byproducts that may be produced during the ALD process. In one embodiment, the inert gas may be nitrogen ($N_2$). The inert gas may be introduced into the chamber, for example, for about 10 seconds. After purging, the chamber may be evacuated or "pumped" to remove gases, such as the excess manganese-containing precursor and the volatile byproducts. For example, the precursor may be purged from the chamber by techniques including, but not limited to, contacting the substrate surface and/or the manganese chemisorbed thereto with the inert gas and/or lowering the pressure in the chamber to below the deposition pressure of the manganese-containing precursor to reduce the concentration of the manganese-containing precursor contacting the substrate surface and/or chemisorbed species. Additionally, purging may include contacting the chemisorbed manganese with any substance that enables chemisorbed byproducts to desorb and reduces a concentration of the manganese-containing precursor and the byproducts before introducing another precursor. A suitable amount of purging to remove the manganese-containing precursor and the byproducts may be determined experimentally, as known to those of ordinary skill in the art. The pump and purge sequences may be repeated multiple times. The pump and purge sequences may start or end with either the pump act or purge act. The time and parameters, such as gas flow, pressure and temperature, during the pump and purge acts may be altered during the pump and purge sequence.

Optionally, the first reaction phase 104 and the gas removal phase 106a may be repeated any number of times, as indicated by arrow 105, to form a monolayer of manganese over the substrate surface. For example, the first reaction phase 104 and the gas removal phase 106a may be repeated in sequence from about two times to about five times to form the monolayer of manganese.

After the gas removal phase 106a, a second reaction phase 108 of the ALD process may introduce an oxygen-containing precursor into the chamber to form oxygen over the chemisorbed manganese. For example, the oxygen-containing precursor may include at least one of ozone, oxygen and nitric oxide. The oxygen and the chemisorbed manganese may react to form an intermediate material containing manganese and oxygen. The intermediate material containing the manganese and the oxygen may include, for example, manganese oxide or an intermediate reactive species containing the manganese and the oxygen. After exposure to the oxygen-containing precursor, reaction byproducts and the excess oxygen-containing precursor may be removed from the chamber using a gas removal phase 106b, including the pump and purge cycle as described above with respect to the gas removal phase 106a. Optionally, the second reaction phase 108 and the gas removal phase 106b may be repeated a number of times, as indicated by arrow 107, to form a monolayer of oxygen over the chemisorbed manganese. For example, the second reaction phase 108 and the gas removal phase 106b may be repeated in sequence from about two times to about five times to form the monolayer of oxygen. The monolayer of oxygen may react with the chemisorbed manganese, which chemisorbed manganese may include at least one monolayer of manganese.

A third reaction phase 110 of the ALD process introduces the praseodymium-containing precursor into the chamber to form praseodymium over the intermediate material containing the manganese and the oxygen. The praseodymium-containing precursor may include $Pr(iPrCp)_3$ and may be introduced into the chamber in a gaseous form. The $Pr(iPrCp)_3$ may be obtained commercially, for example, from Strem Chemicals, Inc. or Adeka Corporation (Tokyo, Japan). As a non-limiting example, the praseodymium-containing precursor may be introduced into the chamber as a mixture with the inert gas or in solution with THF, as previously described. The praseodymium-containing precursor supplied in this phase may be selected such that the amount of praseodymium-containing precursor that may be available to bind to the substrate surface is determined by the number of available binding sites and by the physical size of the chemisorbed species (including ligands). The praseodymium chemisorbed on the substrate surface during exposure to the praseodymium-containing precursor is self-terminated with a surface that is non-reactive with the remaining praseodymium-containing precursor.

For example, $Pr(iPrCp)_3$ may be exposed to the intermediate material containing manganese and oxygen to form $PrMnO_3$ or a reactive intermediate species containing the manganese, the oxygen and praseodymium. After exposure to the praseodymium-containing precursor, reaction byproducts and the excess praseodymium-containing precursor may be removed from the chamber using a gas removal phase 106c including the pump and purge cycle described with respect to the gas removal phase 106a. Optionally, the third reaction phase 110 and the gas removal phase 106c may be repeated a number of times, as indicated by arrow 109, to form a monolayer of praseodymium over the intermediate material containing the manganese and the oxygen. For example, the third reaction phase 110 and the gas removal phase 106c may be repeated in sequence from about two times to about five times to form the monolayer of praseodymium. The monolayer of praseodymium may react with the intermediate material including the manganese and the oxygen, which intermediate material may include at least one monolayer of each of the manganese and the oxygen.

A fourth reaction phase 112 of the ALD process may introduce the calcium-containing precursor into the chamber to form calcium over the intermediate material containing the manganese, the oxygen and the praseodymium. The calcium-containing precursor may include $Ca(iPr_3Cp)_2$ and may be introduced into the chamber to form the calcium over the intermediate material containing the manganese, the oxygen and the praseodymium. As a non-limiting example, the calcium-containing precursor may be introduced into the chamber as a mixture with the inert gas or in solution with THF, as previously described. The calcium and the intermediate material containing the manganese, the oxygen and the praseodymium may react to form the crystalline PCMO material. In some embodiments, a mixture of Ca(tBuCp)$_2$ and Sr(iPrCp)$_3$ may be exposed to the intermediate material containing the manganese, the oxygen and the praseodymium to form a crystalline PCSMO material. After exposure to the calcium-containing precursor, reaction byproducts and the excess calcium-containing precursor may be removed from the chamber by using the gas removal phase 106d including the pump and purge cycle described above with respect to the gas removal phase 106a. Optionally, the fourth reaction phase 112 and the gas removal phase 106d may be repeated a number of times, as indicated by arrow 111, to form a monolayer of calcium over intermediate material containing the manganese, the oxygen and the praseodymium. For example, the fourth reaction phase 112 and the gas removal phase 106d may be repeated in sequence from about two times to about five times to form the monolayer of calcium. The monolayer of calcium may react with the intermediate material including the manganese, the oxygen and the praseodymium, which intermediate material may include at least one monolayer of each of the manganese, the oxygen and the praseodymium.

Exposure of the substrate surface to the precursors during the ALD process may be controlled to optimize the composition of the PCMO material. For example, the crystalline PCMO material formed using the ALD process may have a stoichiometry of $Pr_{0.7}Ca_{0.3}MnO_3$. The crystalline PCMO material may be formed on the substrate through successive or repetitive ALD cycles, as indicated by arrow 113, where each cycle deposits a thickness of the crystalline PCMO material. A desired thickness of the crystalline PCMO material is achieved by performing multiple, repetitious ALD cycles.

For the sake of simplicity, the precursors (i.e., the manganese-containing precursor, the oxygen-containing precursor, the praseodymium-containing precursor and the calcium-containing precursor) are described in FIG. 1 as being introduced to the substrate surface in a particular order. However, the precursors (i.e., the manganese-containing precursor, the oxygen-containing precursor, the praseodymium-containing precursor and the calcium-containing precursor) may be introduced to the substrate surface in any order.

During the ALD process, the pulse times for each of the precursors may be from about 0.5 second to about 30 seconds. Each of the precursors (i.e., the manganese-containing precursor, the oxygen-containing precursor, the praseodymium-containing precursor and the calcium precursor) may be introduced to the substrate surface at a temperature of less than about 450° C. and, more particularly, less than about 400° C.

Forming the PCMO material by ALD provides numerous advantages over other processes of forming the PCMO material, such as MOCVD processes. Specifically, using ALD enables the PCMO material to be deposited in a crystalline state, rather than in an amorphous state. The crystalline PCMO material may be formed with a high degree of uniformity and conformality. Additionally, because the ALD process may be performed at a temperature of less than or equal to about 400° C., the crystalline PCMO material may be formed on a semiconductor or memory device structure without damaging heat-sensitive components, such as metal wiring and interconnects, as will be described. By utilizing the ALD process, the crystalline PCMO material may also be formed in situ at a low temperature.

Figure 2A:
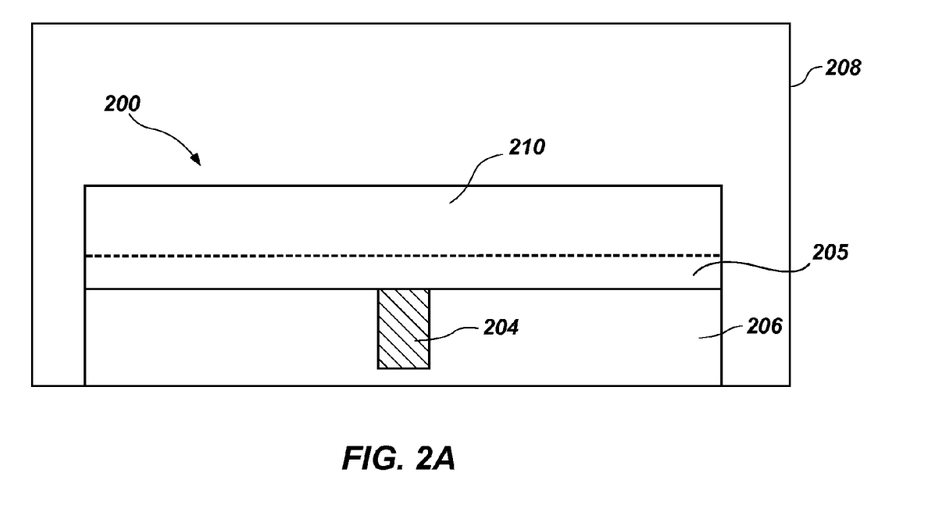
FIGS. 2A and 2B are schematics illustrating a method of forming a semiconductor device in accordance with embodiments of the disclosure.
Figure 2B:
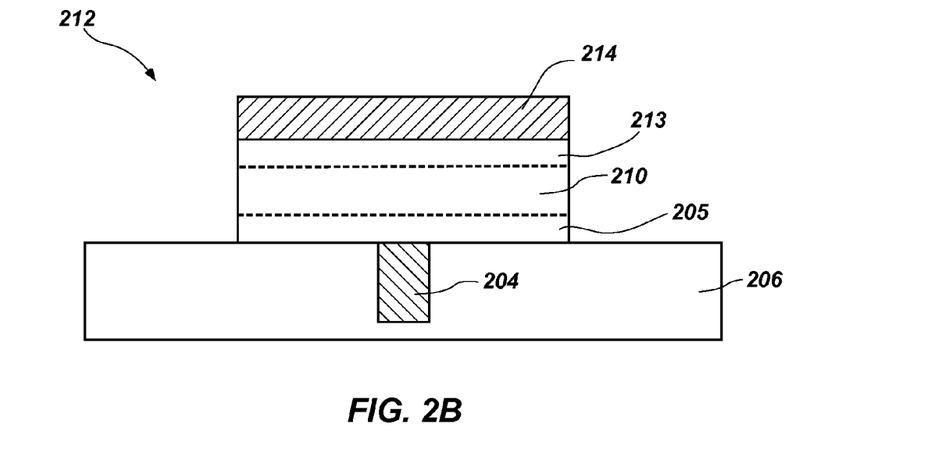

FIGS. 2A and 2B illustrate a method of forming a semiconductor structure, such as a variable resistance memory cell, including a crystalline PCMO material that may be formed according to embodiments of the present disclosure. For example, a semiconductor structure 200 may be formed that includes a first electrode 204 in a substrate 206 and, optionally, an oxide material 205 (shown in broken lines) overlying the substrate 206. As a non-limiting example, the substrate 206 may be a doped polysilicon material. The first electrode 204 may be formed from a conductive material, such as copper, tungsten, nickel, tantalum, titanium, titanium nitride, aluminum, platinum, alloys thereof, amongst others. The first electrode 204 may be formed using conventional semiconductor fabrication processes known in the art, which are not described in detail herein. The oxide material 205 may be formed from a rare earth metal oxide, such as zirconia ($ZrO_x$), yttrium oxide ($YO_x$), erbium oxide ($ErO_x$), gadolinium oxide ($GdO_x$), lanthanum aluminum oxide ($LaAlO_x$), and hafnium oxide ($HfO_x$) using a conventional deposition process, such as, a CVD process or an ALD process.

The semiconductor structure 200 may be placed in a chamber 208 (or may remain in the chamber 208 after deposition of the oxide material 205) and a crystalline PCMO material 210 may be formed on the surface of the semiconductor structure 200 using an ALD process such as that described with respect to FIG. 1. For example, a manganese-containing precursor, an oxygen-containing precursor, a praseodymium-containing precursor and a calcium-containing precursor may be separately and repeatedly exposed to the surface of the semiconductor structure 200 in the chamber 208 to form the crystalline PCMO material 210. The manganese-containing precursor, the oxygen-containing precursor, the praseodymium-containing precursor and the calcium-containing precursor may be introduced into the chamber 208 in any order and may be introduced any number of times to form a desired thickness of the crystalline PCMO material 210 overlying the substrate 206. The ALD process may be performed at a temperature of less than about 450° C. and, thus, may form the crystalline PCMO material 210 without damaging the first electrode 204 or other conductive lines or wiring (not shown).

As shown in FIG. 2B, a second electrode 214 and, optionally, another oxide material 213 (shown in broken lines), may be formed over the crystalline PCMO material 210 to produce the variable resistance memory cell 212. A portion of the crystalline PCMO material 210 may be removed using conventional semiconductor fabrication techniques, which are not described in detail herein. If present, the oxide material 213 may be formed from a rare earth metal oxide, such as zirconia ($ZrO_x$), yttrium oxide ($YO_x$), erbium oxide ($ErO_x$), gadolinium oxide ($GdO_x$), lanthanum aluminum oxide ($LaAlO_x$), and hafnium oxide ($HfO_x$) using a conventional deposition process, such as, a CVD process or an ALD process. The second electrode 214 may include a conductive material and may be foamed over remaining portions of the crystalline PCMO material 210 using conventional semiconductor fabrication techniques, which are not described in detail herein.

CONCLUSION

In one embodiment, the present disclosure includes a method of forming a PCMO material that includes forming a PCMO material on a substrate by an atomic layer deposition process.

In a further embodiment, the method of forming the PCMO material includes introducing a plurality of gaseous precursors to a surface of a substrate to form a plurality of manganese, oxygen, praseodymium, and calcium monolayers thereon and reacting the manganese, oxygen, praseodymium, and calcium monolayers to form a crystalline PCMO material.

In yet another embodiment, the present invention includes a semiconductor structure including a crystalline PCMO material overlying a substrate. The crystalline PCMO material is formed by separately and repeatedly introducing a manganese-containing precursor, an oxygen-containing gaseous precursor, a praseodymium-containing precursor and a calcium-containing precursor to a surface of the substrate.

In yet another embodiment, the present invention includes a method of forming a semiconductor structure including forming at least one electrode on a substrate and separately and repeatedly exposing a manganese-containing precursor, an oxygen-containing gaseous precursor, a praseodymium-containing precursor and a calcium-containing precursor to a surface of the substrate to form a crystalline PCMO material thereon. At least another electrode may be formed over the crystalline PCMO material.

While the invention is susceptible to various modifications and alternative forms, specific embodiments have been shown by way of example in the drawings and have been described in detail herein. However, the invention is not intended to be limited to the particular forms disclosed. Rather, the invention is to cover all modifications, equivalents, and alternatives falling within the scope of the invention as defined by the following appended claims and their legal equivalents.

What is claimed is:

1. A method of forming a PCMO material, comprising:
   selecting a praseodymium-containing precursor comprising a cyclopentadienyl ligand (Cp);
   selecting a calcium-containing precursor comprising a cyclopentadienyl ligand (Cp);and separately exposing a surface of a substrate to each of the praseodymium-containing precursor, the calcium-containing precursor, a manganese-containing precursor, and an oxygen-containing precursor to deposit a PCMO material in a crystalline state over the substrate by an atomic layer deposition process conducted at a temperature of less than about 450° C.

2. The method of claim 1, wherein separately exposing a surface of a substrate to each of the praseodymium-containing precursor, the calcium-containing precursor, a manganese-containing precursor, and an oxygen-containing precursor comprises introducing each of the praseodymium-containing precursor, the calcium-containing precursor, the manganese-containing precursor, and the oxygen-containing precursor into a chamber containing the substrate.

3. The method of claim 1, further comprising selecting the manganese-containing precursor comprising a cyclopentadienyl ligand (Cp).

4. The method of claim 3, wherein each of selecting the manganese-containing precursor comprising a cyclopentadienyl ligand, selecting the praseodymium-containing precursor comprising a cyclopentadienyl ligand, and selecting the calcium-containing precursor comprising a cyclopentadienyl ligand comprises selecting each of the manganese-containing precursor, the praseodymium-containing precursor, and the calcium-containing precursor from at least one compound having the formula $M(MeCp)_n$, $M(EtCp)_n$, $M(iPrCp)_n$, $M(tBuCp)_n$, $M(Me_4Cp)_n$, $M(Me_5Cp)_n$, and $MCp(CO)_n$, wherein M represents manganese, praseodymium, or calcium and n represents a number of ligands used to balance the charge of the manganese, praseodymium, or calcium.

5. The method of claim 1, further comprising selecting the oxygen-containing precursor from at least one of ozone, oxygen, and nitric oxide.

6. The method of claim 3, wherein selecting the manganese-containing precursor comprising a cyclopentadienyl ligand comprises selecting the manganese-containing precursor comprising a material having the formula $MnCp(CO)_3$.

7. The method of claim 1, wherein selecting a praseodymium-containing precursor comprising a cyclopentadienyl ligand comprises selecting a praseodymium-containing precursor having the formula $Pr(RCp)_3$, wherein R is an alkyl group.

8. The method of claim 1, wherein selecting a calcium-containing precursor comprising a cyclopentadienyl ligand comprises selecting a calcium-containing precursor having the formula $Ca(RCp)_2$, wherein R is an alkyl group.

9. The method of claim 1, further comprising repeating the separately exposing a surface of the substrate to each of the praseodymium-containing precursor, the calcium-containing precursor, the manganese-containing precursor, and the oxygen-containing precursor to increase a thickness of the PCMO material.

10. The method of claim 1, wherein separately exposing a surface of a substrate to each of the praseodymium-containing precursor, the calcium-containing precursor, a manganese-containing precursor, and an oxygen-containing precursor to deposit a PCMO material in a crystalline state over the substrate by an atomic layer deposition process comprises depositing a PCMO material in a crystalline state having a stoichiometry of $Pr_{0.7}Ca_{0.3}MnO_3$ over the substrate by the atomic layer deposition process.

11. A method of forming a PCMO material, comprising:
    introducing a plurality of gaseous precursors to a surface of a substrate at a temperature of less than about 450° C. to form a plurality of manganese, oxygen, praseodymium, and calcium monolayers thereon, the plurality of gaseous precursors comprising a praseodymium-containing precursor comprising a cyclopentadienyl ligand (Cp) and a calcium-containing precursor comprising a cyclopentadienyl ligand (Cp); and
    reacting the plurality of manganese, oxygen, praseodymium, and calcium monolayers to form a crystalline PCMO material without forming an amorphous PCMO material.

12. The method of claim 11, wherein introducing a plurality of gaseous precursors to a surface of a substrate to form a plurality of manganese, oxygen, praseodymium, and calcium monolayers thereon comprises repeatedly introducing each of a manganese-containing precursor, an oxygen-containing precursor, a praseodymium-containing precursor, and a calcium-containing precursor to the surface of the substrate to form the plurality of manganese, oxygen, praseodymium, and calcium monolayers.

13. The method of claim 11, wherein introducing a plurality of gaseous precursors to a surface of a substrate to form a plurality of manganese, oxygen, praseodymium, and calcium monolayers thereon comprises introducing a plurality of precursors, each comprising a compound having one of the formulas $MCp_n$, $M(MeCp)_n$, $M(EtCp)_n$, $M(iPrCp)_n$, $M(tBuCp)_n$, $M(Me_4Cp)_n$, $M(Me_5Cp)_n$, $MCp(CO)_n$ and $MMeCp(CO)_n$, wherein M is manganese, praseodymium, or calcium, and n is a number of ligands used to balance a charge of the at least one of the manganese, praseodymium, or calcium.

14. The method of claim 11, wherein introducing a plurality of gaseous precursors to a surface of a substrate to form a plurality of manganese, oxygen, praseodymium, and calcium monolayers thereon comprises introducing the plurality of gaseous precursors to the surface of the substrate at a temperature of about 400° C.

15. The method of claim 11, wherein introducing a plurality of gaseous precursors to a surface of a substrate to form a plurality of manganese, oxygen, praseodymium, and calcium monolayers thereon comprises repeatedly introducing $Mn(CpCO)_2$ or $MnCp(CO)_3$ to the surface of the substrate to form at least one monolayer of manganese.

16. The method of claim 11, wherein introducing a plurality of gaseous precursors to a surface of a substrate to form a plurality of manganese, oxygen, praseodymium, and calcium monolayers thereon comprises repeatedly introducing a praseodymium-containing precursor having the formula $Pr(RCp)_3$, wherein R is an alkyl group, to the surface of the substrate to form at least one monolayer of praseodymium.

17. The method of claim 11, wherein introducing a plurality of gaseous precursors to a surface of a substrate to form a plurality of manganese, oxygen, praseodymium, and calcium monolayers thereon comprises repeatedly introducing a calcium-containing precursor having the formula $Ca(RCp)_2$, wherein R is an alkyl group, to the surface of the substrate to form at least one monolayer of calcium.

18. A method of forming a semiconductor structure, comprising:

forming at least one electrode on a substrate; and separately and repeatedly exposing the substrate at a temperature of less than about 450° C. to a manganese-containing precursor, an oxygen-containing gaseous precursor, a praseodymium-containing precursor, and a calcium-containing precursor to deposit a crystalline PCMO material on the substrate, wherein the praseodymium-containing precursor comprises the formula $Pr(RCp)_3$, wherein the calcium-containing precursor comprises the formula $Ca(RCp)_2$, wherein Cp comprises a cyclopentadienyl ligand, and wherein R comprises an alkyl group.

19. The method of claim 18, further comprising disposing an oxide material over at least one surface of the crystalline PCMO material.

20. The method of claim 18, further comprising forming at least another electrode over the crystalline PCMO material.

* * * * *

UNITED STATES PATENT AND TRADEMARK OFFICE
CERTIFICATE OF CORRECTION

PATENT NO.      : 8,420,534 B2                                Page 1 of 1
APPLICATION NO. : 12/902590
DATED           : April 16, 2013
INVENTOR(S)     : Eugene P. Marsh It is certified that error appears in the above-identified patent and that said Letters Patent is hereby corrected as shown below:

On the Title Page, Item (56), under "Other Publications", column 2, line 6, delete "Cyclopentadianyl" and insert -- Cyclopentadienyl --, therefor.

In the Claims:

In column 9, line 31, in Claim 1, delete "(Cp);and" and insert -- (Cp); and --, therefor.

In column 10, line 54, in Claim 13, delete "$MCp(CP)_n$" and insert -- $MCp(CP)_n$, --, therefor.

Signed and Sealed this
Eighteenth Day of June, 2013

Teresa Stanek Rea
*Acting Director of the United States Patent and Trademark Office*